(12) United States Patent
Velichko et al.

(10) Patent No.: US 7,619,184 B2
(45) Date of Patent: Nov. 17, 2009

(54) MULTI-PARAMETER PROCESS AND CONTROL METHOD

(75) Inventors: Sergey A. Velichko, Boise, ID (US); Jeffrey S. Nelson, Boise, ID (US); Roger W. Eagans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 10/378,757

(22) Filed: Mar. 4, 2003

(65) Prior Publication Data

US 2004/0173599 A1 Sep. 9, 2004

(51) Int. Cl.
*H05B 1/02* (2006.01)

(52) U.S. Cl. .................. 219/494; 219/121.43; 219/486; 219/121.4; 392/418; 118/725; 324/763

(58) Field of Classification Search ................. 219/497, 219/494, 502, 505, 121.4, 121.41, 121.43, 219/483–487, 506; 392/416, 418; 118/724, 118/725; 324/763, 765
See application file for complete search history.

(56) References Cited

U.S. PATENT DOCUMENTS

| 4,086,424 | A | 4/1978 | Mellen, Sr. |
| 4,907,177 | A | 3/1990 | Curreri et al. |
| 5,408,405 | A | 4/1995 | Mozumder et al. |
| 5,436,172 | A | 7/1995 | Moslehi |
| 5,526,293 | A | 6/1996 | Mozumder et al. |
| 5,661,669 | A | 8/1997 | Mozumder et al. |
| 5,824,149 | A | 10/1998 | Li |
| 5,968,587 | A * | 10/1999 | Frankel .................. 427/8 |
| 5,994,675 | A | 11/1999 | Bethune et al. |
| 6,139,627 | A | 10/2000 | Duval et al. |
| 6,222,164 | B1 | 4/2001 | Stoddard et al. |
| 6,329,643 | B1 | 12/2001 | Suzuki et al. |
| 6,373,033 | B1 * | 4/2002 | de Waard et al. ............ 219/497 |
| 6,850,322 | B2 | 2/2005 | Campbell et al. |
| 7,225,095 | B2 | 5/2007 | Bras |

FOREIGN PATENT DOCUMENTS

WO        WO 98/39793         9/1998

OTHER PUBLICATIONS

Moyne, et al., Run-to-Run Control in Semiconductor Manufacturing, CRC Press, 2001, 5 pages.
Pierson, Hugh O., Handbook of Chemical Vapor Deposition Principles, Technology, and Application, Noyes Publications, 1992, pp. 223-224.
Wilson, et al., Improved Heterogeneous Distance Functions, Journal of Artificial Intelligence Research, vol. 6, 1997, pp. 1-34.
Wolf, et al., Silicon Processing for the VLSI Era, vol. 1—Process Technology, Lattice Press, 1996, p. 193.

* cited by examiner

*Primary Examiner*—Mark H Paschall
(74) *Attorney, Agent, or Firm*—TraskBritt (57) ABSTRACT

A method and system for generating control settings for a multi-parameter control system. The interdependencies of processing tools and the related effect on semiconductor wafers within a processing tool is factored into a mathematical model that considers desired and measured wafer quality parameters in the derivation of specific solutions of sets of possible quality parameter adjustments. A selection process determines a set of adjustments such as one that results in minimal changes to the process.

41 Claims, 8 Drawing Sheets

MULTI-PARAMETER PROCESS AND CONTROL METHOD

BACKGROUND OF THE INVENTION

1. Field of the Invention

The present invention relates generally to processes for semiconductor wafers and, more particularly, to control and specification of temperature processes for a semiconductor processing furnace.

2. State of the Art

Semiconductor processing advancements continue to facilitate reduction in feature dimensions which in turn results in increased performance and circuitry integration. While feature size reductions have been considerable, continuous improvements are being pursued. With the reduction in feature size, the criticality of accurate control during manufacturing processes becomes more essential. Specifically, the temperature imposed upon a semiconductor wafer during a manufacturing process affects the diffusion of dopants, as well as the deposition of materials on the semiconductor wafer. Thus, it is important that processing systems achieve accurate control to obtain the desired effect on the semiconductor wafer undergoing processing.

In order to maintain an acceptable level of quality control, many semiconductor processes are performed in iterative incremental "runs" that allow for control feedback to be entered into the processing specification of each subsequent run. On a specific run, a process specification may include a set-point temperature, temperature process duration, a temperature ramp rate, etc., that define the overall thermal process to be encountered by the semiconductor wafer.

Process specifications may be further complicated by the introduction of a gas or other vapor which may also be affected by the temperature and thermal profile. Therefore, various temperature control problems must be attended to by a processing system in order to maintain an acceptable level of quality control, i.e., yield, of semiconductor wafers. In an effort to enhance the yield of operable circuits on a wafer, it would be desirable that each wafer in a group or "batch" be subjected to the same temperature conditions over an entire thermal processing cycle or run. If uncontrolled, the variations in the processing of the semiconductor wafers within a batch result in unacceptable deviations and such deviations are further exaggerated over subsequent runs which inject further deviations into the overall process.

A still further temperature control problem exists in thermal processing systems, such as furnaces, that utilize multiple heating elements. Multiple-zone furnaces can be used to better optimize the thermal profile in larger furnaces capable of handling a large number of wafers. Large capacity furnaces are designed with multiple heating elements to provide more uniform heating across the entire cavity of the furnace. However, due to the nature of a zone's heat flow, as well as the interactive nature of adjacent zones within an open cavity, thermal variations can and do exist within a single cavity of a multi-zone furnace. While it is possible to control a specific zone within a multi-zone configuration, the affect of the interaction between zones has largely gone unaddressed and unappreciated. While one or more wafers within a specific zone may be evaluated following the completion of a specific run, thermal compensation for such processing deviations have been limited to an adjustment of that specific zone for a subsequent thermal process during a subsequent run of that specific wafer or group of wafers, regardless of the influence or affect of such an adjustment on other wafers within other zones of the system.

Thus, it is desirable to implement a system and method that takes into account the affect of modifications of thermal adjustments implemented in one zone and the related effect of such an adjustment on the other zones within the system.

BRIEF SUMMARY OF THE INVENTION

The present invention includes methods and systems for generating control settings for use in a multi-parameter semiconductor tool that processes semiconductor wafers on a run-to-run basis. As used herein, the term "semiconductor wafer" includes not only conventional silicon wafers, but also other bulk semiconductor substrates such as silicon-on-insulator (SOI), silicon-on-glass(SOG) and silicon-on-sapphire (SOS) substrates, as well as other semiconductor materials such as, by way of example only, gallium arsenide, and iridium phosphide. Generally, the present invention provides a polynomial system model of a processing tool which enables simultaneous calculation of parameter adjustments in pursuit of run-to-run control of a wafer process. The method takes into consideration the cross-influence of the changes in each controlled parameter and the effect such change has on all of the other parameters of interest. The present invention facilitates an improved yield due to the more precise characterization of the influence of a controlled parameter adjustment on the quality parameters of wafers in other chambers within the tool. Furthermore, the control settings are calculated from models as opposed to being adjusted using ad hoc approaches.

The present invention also includes specific methods and systems for generating control settings for use in a multi-zone semiconductor furnace that processes semiconductor wafers on a run-to-run basis. One specific embodiment of the present invention provides a polynomial system model of a diffusion furnace which enables simultaneous calculation of temperature adjustments in pursuit of run-to-run control of a wafer process. The method takes into consideration the cross-influence of the temperature changes in each zone and the effect such change has on all of the other zones. The present invention facilitates an improved yield due to the more precise characterization of the influence of a zone's temperature adjustment on the film growth of wafers in other zones within the furnace. Furthermore, the temperature control settings are calculated from models as opposed to being adjusted using ad hoc approaches.

According to one embodiment of the present invention, temperature control settings are generated for controlling a multi-zone semiconductor furnace used for the processing of semiconductor wafers. The zonal influence between the multiple zones within a multi-zone furnace is characterized and a transfer function is derived. Following a run of the wafers within the multi-zone furnace, a wafer from each zone is evaluated. The thickness of the deposited film is measured or, alternatively, a thickness of the deposited film is otherwise characterized for each of the zones for use as inputs into the polynomial model. Optionally, a filter is injected into the model following the measurement of the film thickness. Such a filter facilitates the removal or mitigation of random noise injected into the system by the measurement characterization instruments or random fluctuations of the process.

Temperature adjustments are calculated from the measured film thicknesses, as well as from the desired film thickness for each of the zones. The calculation of possible temperature adjustments results in a number of possible solutions corresponding to the order of the polynomial. A preferred solution or set of temperature adjustments is calculated according to a predefined criterion. One such criterion is the minimum overall adjustments to the system. Such a solution inserts the least perturbations into a heretofore refined, but otherwise comprehensively uncharacterized process.

According to another embodiment of the invention, a multi-zone semiconductor furnace controls a run-to-run semiconductor process on semiconductor wafers by applying the control settings respectively generated from the process above to control the respective zones within a multi-zone semiconductor furnace. The present invention finds application not only to diffusion processes but to all semiconductor processes that grow or deposit films in a chamber or environment that has separately controllable environment control elements, such as heating elements.

According to yet another embodiment of the present invention, a multi-parameter control system controls a run-to-run semiconductor process on semiconductor wafers by applying the control settings respectively generated similar to the process above to control respective quality wafer parameters within a multi-chambered or single chambered tool. The present invention finds application not only to semiconductor processes that grow or deposit films but to all semiconductor processes that generally have separately controllable control elements, such a gas flow controllers, chemical liquid flow controllers, plasma control elements, temperature and humidity control elements, and the like.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
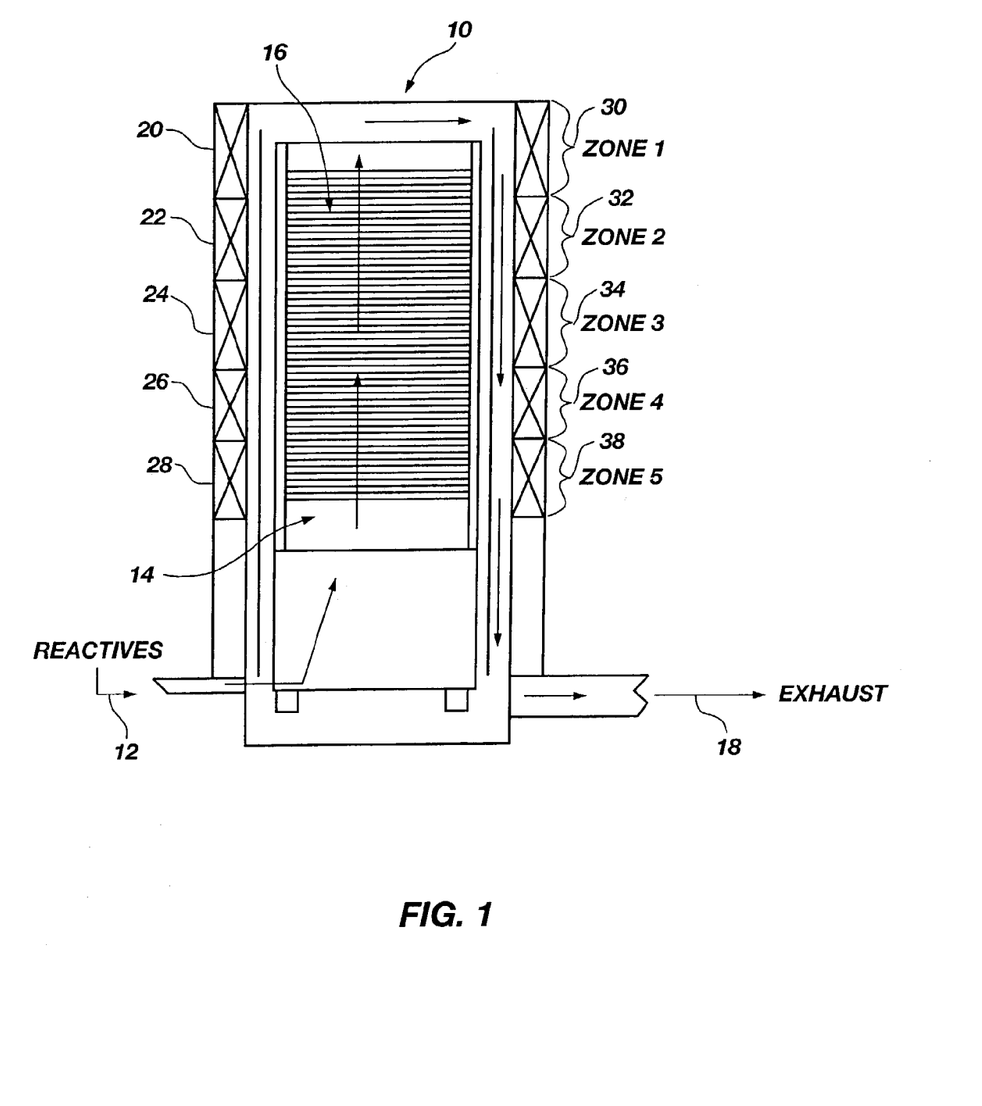
FIG. 1 illustrates a configuration of a semiconductor furnace having a multi-zone configuration, in accordance with an embodiment of the present invention.

FIG. 1 illustrates a multi-zone semiconductor furnace 10, in accordance with an embodiment of the present invention. The semiconductor furnace 10, as depicted, may be utilized for various semiconductor manufacturing processes including the depositing and/or growing of films on a substrate, such as a silicon wafer. While various diffusion, deposition, and other semiconductor manufacturing processes are contemplated as within the scope of the present invention, an exemplary diffusion process will be illustrated and discussed as a means of facilitating an understanding thereof.

One exemplary and illustrative process includes the deposition of nitride which is generally done in a Low Pressure Chemical Vapor Deposition (LPCVD) process that may be thermally driven by irradiative heat transfer which in turn drives or induces a chemical reaction on a substrate, such as a silicon wafer, between, for example, dichlorosilane and ammonia to deposit what is commonly referred to as silicon nitride or oftentimes is simplistically referred to as just "nitride." FIG. 1 illustrates such a process being undertaken in semiconductor furnace 10. In FIG. 1, reactives 12 enter semiconductor furnace 10 into a wafer chamber 14 housing a plurality of semiconductor wafers, a plurality of which are shown in a vertically stacked, horizontally oriented arrangement generally depicted as wafers 16. Reactives 12 pass through wafer chamber 14 and circulate about wafers 16 and are then exhausted from semiconductor furnace 10 as exhaust gases 18.

The equation below illustrates the chemical reaction of this specific illustrative example.

Those of ordinary skill in the art appreciate that nitride is used in the semiconductor industry as an insulator commonly used to separate conductive films from one another so that a desired architecture of electrical circuits may be achieved.

FIG. 1 further illustrates the multi-zone configuration of semiconductor furnace 10. While semiconductor furnace 10 may be implemented with any number of zones, by way of illustration, FIG. 1 illustrates a multi-zone semiconductor furnace 10 having five specific circular or donut-shaped heating elements 20-28, which define corresponding zones 30-38. Each of these respective zones is independently controllable with each of the specific heating elements 20-28 providing localized heat to the respective zones 30-38. By way of example, a plurality of wafers 16, which may number in the tens and even hundreds of wafers, may be loaded into wafer chamber 14 to undergo a specific semiconductor process.

Those of ordinary skill in the art appreciate that a growth rate, for example, of nitride film is dependent upon process variables including: (1) heat and temperature, (2) pressure, (3) reactive gas flow, (4) reactant ratios, and (5) time. Due to the partitioned nature or zoning of wafer chamber 14, the plurality of semiconductor wafers 16 is subjected to independent control of the available heat for each zone 30-38. Such independent or regionalized control assists in generating a more uniform chemical reaction across the entire vertical array of semiconductor wafers 16, thereby resulting in a more uniform or desired film thickness on each of the plurality of wafers 16. In a process control environment, each zone may integrate a test wafer within the vertically stacked wafers 16 for use as a wafer from which to derive a measured film thickness between subsequent runs of wafer 16 within semiconductor furnace 10.

The film thickness on a semiconductor surface achieved through a process within semiconductor furnace 10 exhibits a strong correlation between both the temperature in a particular zone in the presence of a corresponding gas and the maintenance of temperature in a zone over a period of time. It is appreciated that certain temperature ramps are required for obtaining uniform depositions, i.e., film deposition rate generally exhibits linear dependence on the process temperature. After a specific period of time, a strong linear relationship between film thickness and elapsed time exists as process temperature and flow of gas reactants remains relatively constant.

Therefore, since the film deposition rate is dependent on a temperature gradient across an entire wafer chamber 14, an entire process at a stable linear stage within semiconductor furnace 10 may be described using a model unifying all zones. However, the present invention appreciates that any temperature change in any one zone will affect film thickness in all other zones. Therefore, an improved approach is to model all zones affecting each other in accordance with a thermal transfer function which directly affects resultant film thickness.

Figure 2:
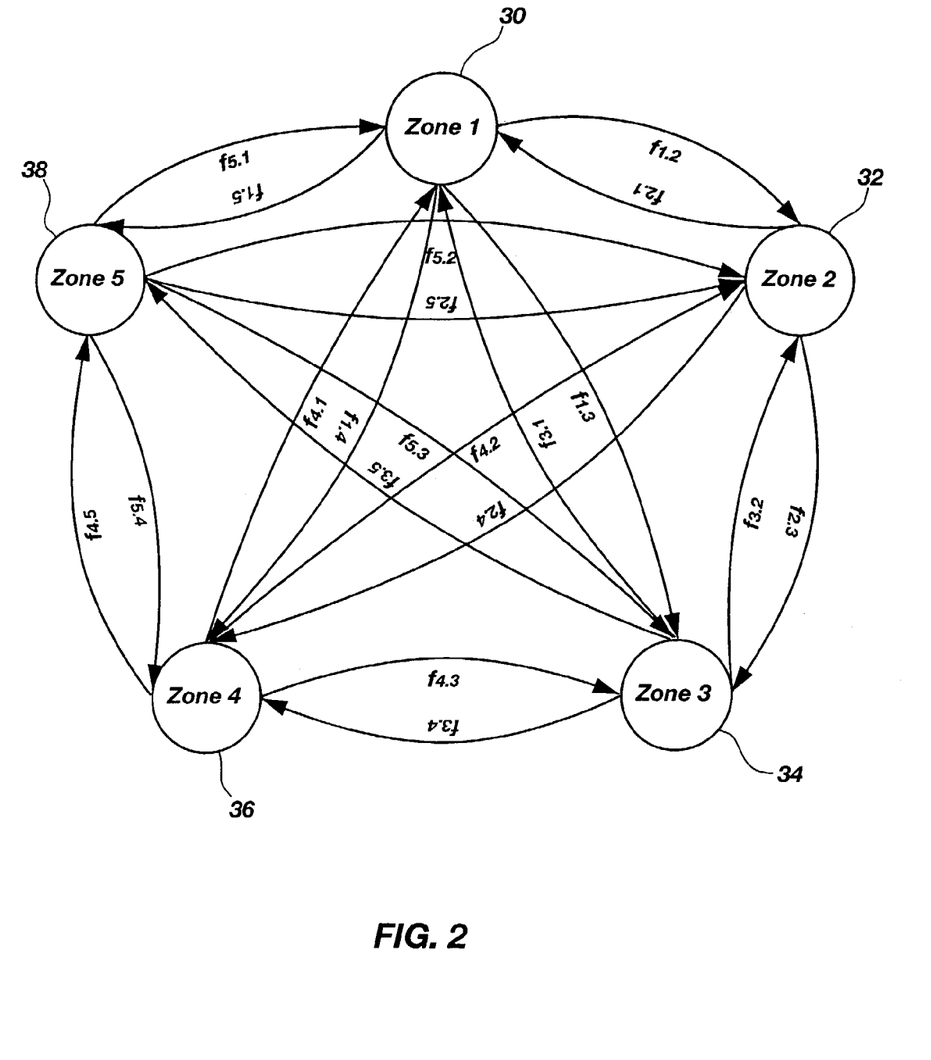
FIG. 2 illustrates a directional graph describing the mathematical interrelationship of the multi-zones of a multi-zone semiconductor furnace, in accordance with an embodiment of the present invention.

FIG. 2 illustrates a model of a full directional graph for a multi-zone semiconductor furnace, illustrated by way of example, as a five-zone furnace. In the illustration, each of the thermal transfer functions, $f_{i,j}$, is illustrated as having an influence on each of the other respective zones. The thermal transfer functions further include a unit of measure, for example, in angstroms/° C., and describe the final film thickness change in a zone j, upon the temperature change in a zone i. For this calculation, it is acceptable to assume that the temperature change is constant during the entire process time while wafers 16 (FIG. 1) are within semiconductor furnace 10 (FIG. 1). Thus, a temperature change from run-to-run at any zone affects in some degree all other zones within semiconductor furnace 10 (FIG. 1). It should be noted that functions $f_{i,j}$ can be positive or negative in reference to the temperature change in relation to each zone and the functions also exhibit different contributions to each zone while temperature changes in the positive or negative direction. Such a contribution, in the present vertically oriented furnace, may be attributed to the specific furnace design, location of the reactives inlet, for example, in the bottom of wafer chamber 14 (FIG. 1), as well as the mass transport theory which results in the depletion of the quantity of reactive material.

In the proposed model of the present embodiment, the process may be described using a system of polynomial equations approximating the transfer functions in which the resultant film thickness change in each zone depends on all of the changes of zone temperatures. For example, for the five-zone furnace exemplary illustration, the process may be mathematically depicted as follows:

$$\begin{bmatrix} a_{n1,1} & a_{n1,2} & a_{n1,3} & a_{n1,4} & a_{n1,5} \\ a_{n2,1} & a_{n2,2} & a_{n2,3} & a_{n2,4} & a_{n2,5} \\ a_{n3,1} & a_{n3,2} & a_{n3,3} & a_{n3,4} & a_{n3,5} \\ a_{n4,1} & a_{n4,2} & a_{n4,3} & a_{n4,4} & a_{n4,5} \\ a_{n5,1} & a_{n5,2} & a_{n5,3} & a_{n5,4} & a_{n5,5} \end{bmatrix} \cdot \begin{bmatrix} (T_1 - T_{1s})^n \\ (T_2 - T_{2s})^n \\ (T_3 - T_{3s})^n \\ (T_4 - T_{4s})^n \\ (T_5 - T_{5s})^n \end{bmatrix} + \dots + \quad (1)$$

$$\begin{bmatrix} a_{11,1} & a_{11,2} & a_{11,3} & a_{11,4} & a_{11,5} \\ a_{12,1} & a_{12,2} & a_{12,3} & a_{12,4} & a_{12,5} \\ a_{13,1} & a_{13,2} & a_{13,3} & a_{13,4} & a_{13,5} \\ a_{14,1} & a_{14,2} & a_{14,3} & a_{14,4} & a_{14,5} \\ a_{15,1} & a_{15,2} & a_{15,3} & a_{15,4} & a_{15,5} \end{bmatrix} \cdot \begin{bmatrix} T_1 - T_{1s} \\ T_2 - T_{2s} \\ T_3 - T_{3s} \\ T_4 - T_{4s} \\ T_5 - T_{5s} \end{bmatrix} = \begin{bmatrix} FT_{1t} - FT_1 \\ FT_{2t} - FT_2 \\ FT_{3t} - FT_3 \\ FT_{4t} - FT_4 \\ FT_{5t} - FT_5 \end{bmatrix}$$

where $a_{k i,j}$ are thermal transfer process coefficients, $T_i$ are actual temperatures for each corresponding zone; $T_{is}$ are suggested temperatures for each corresponding zone in attempt to correct and bring film thickness to the zone targets $FT_{it}$, and $FT_i$ are actual post process film thickness measurements in each zone. Considering that $T_i - T_{is} = \Delta T_i$ and $FT_{it} - FT_i = \Delta FT_i$, the system of equations (1) can be shown as:

$$\begin{bmatrix} a_{n1,1} & a_{n1,2} & a_{n1,3} & a_{n1,4} & a_{n1,5} \\ a_{n2,1} & a_{n2,2} & a_{n2,3} & a_{n2,4} & a_{n2,5} \\ a_{n3,1} & a_{n3,2} & a_{n3,3} & a_{n3,4} & a_{n3,5} \\ a_{n4,1} & a_{n4,2} & a_{n4,3} & a_{n4,4} & a_{n4,5} \\ a_{n5,1} & a_{n5,2} & a_{n5,3} & a_{n5,4} & a_{n5,5} \end{bmatrix} \cdot \begin{bmatrix} \Delta T_1^n \\ \Delta T_2^n \\ \Delta T_3^n \\ \Delta T_4^n \\ \Delta T_5^n \end{bmatrix} + \dots + \quad (2)$$

$$\begin{bmatrix} a_{11,1} & a_{11,2} & a_{11,3} & a_{11,4} & a_{11,5} \\ a_{12,1} & a_{12,2} & a_{12,3} & a_{12,4} & a_{12,5} \\ a_{13,1} & a_{13,2} & a_{13,3} & a_{13,4} & a_{13,5} \\ a_{14,1} & a_{14,2} & a_{14,3} & a_{14,4} & a_{14,5} \\ a_{15,1} & a_{15,2} & a_{15,3} & a_{15,4} & a_{15,5} \end{bmatrix} \cdot \begin{bmatrix} \Delta T_1 \\ \Delta T_2 \\ \Delta T_3 \\ \Delta T_4 \\ \Delta T_5 \end{bmatrix} = \begin{bmatrix} \Delta FT_1 \\ \Delta FT_2 \\ \Delta FT_3 \\ \Delta FT_4 \\ \Delta FT_5 \end{bmatrix}$$

or it can be written more generally in matrix form as:

$$A_n \cdot \Delta T^n + A_{n-1} \cdot \Delta T^{n-1} + \dots + A_1 \cdot \Delta T = \Delta FT \quad (3)$$

It should be noted that $\Delta T^n$ in equations (3) represent vectors of temperature changes in corresponding power, not the power of a vector of temperature changes. The system of equations (3) quantitatively describes processing in the illustrated five-zone diffusion furnace with modifications to any number of zones through the scaling of the matrices. It should be noted that equations (3) do not contain members describing combined influence of the temperature changes as they are considered negligible when compared with the prime members of equations (3). Additionally, it should be noted that equations (3) represent a system of first order differential equations describing a diffusion furnace reaction to the temperature changes in each zone. Those of ordinary skill in the art may determine a similar system of differential equations for any semiconductor processing tool describing the tool reaction to the process control parameters changes using a design of the experiment (DOE) approach.

Figure 3A:
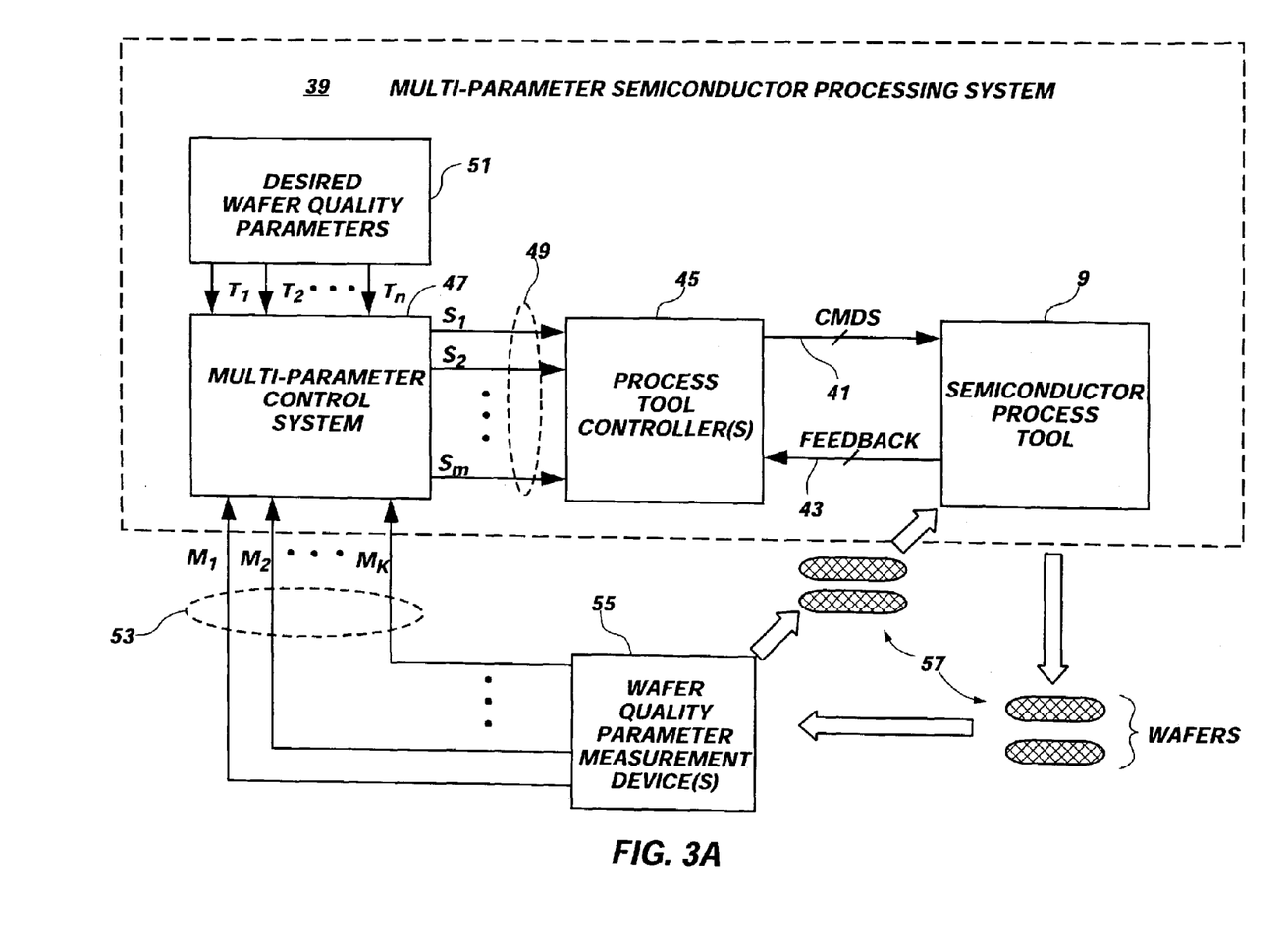
FIG. 3A is a block diagram of a multi-parameter semiconductor processing system, in accordance with an embodiment of the present invention.

FIG. 3A illustrates is a block diagram of a multi-parameter semiconductor processing system 39, in accordance with an embodiment of the present invention. Multi-parameter semiconductor processing system 39 is comprised of a semiconductor process tool 9 which receives commands 41 and provides feedback 43. Commands 41 and feedback 43 are exchanged with process tool controllers 45 which may be further physically integrated with semiconductor process tool 9 or may be separately attached. Process tool controllers 45 receive discrete commands and configure semiconductor process tool 9 accordingly.

Multi-parameter semiconductor processing system 39 is further comprised of a multi-parameter control system 47 which utilizes the modeling described herein for the derivation of the specific commands illustrated generally as specific tool process parameter settings 49. The calculation of tool process parameter settings 49 is further performed within multi-parameter control system 47 and is calculated from inputs illustrated as desired wafer quality parameters 51 (e.g., process target values, film thickness, particle count, dopant concentration, critical dimension, etc.) and from post-run measured wafer quality parameters 53, generally depicted as measured wafer quality parameters 53. Measured wafer quality parameters 53, derived from an evaluation tool such as a wafer quality parameters measurement device 55, provides feedback to multi-parameter control system 47 upon the evaluation of the quality parameters post-run on specific test or process wafers, such as wafers 57. As illustrated, once wafers 57 undergo an evaluation by wafer quality parameters measurement device 55, wafers 57 may be returned to semiconductor process tool 9 for subsequent run processing. While the present illustration depicts wafers 57 being removed from semiconductor process tool 9 for an ex situ measurement, the present invention further contemplates measurement device capability being present within semiconductor process tool 9 for an in situ measurement of a wafer quality parameter.

Figure 3B:
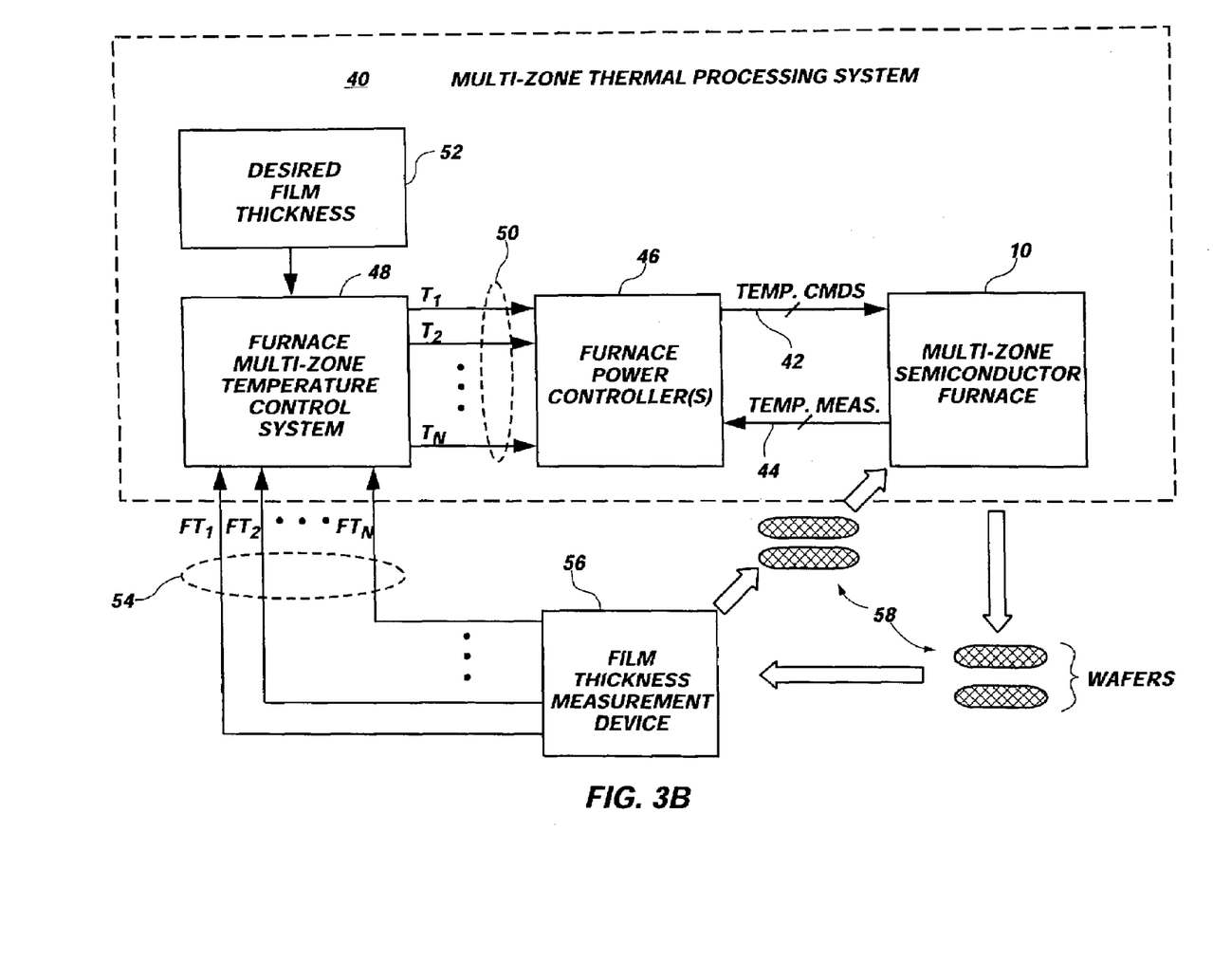
FIG. 3B is a block diagram of a multi-parameter semiconductor process utilizing a multi-zone temperature control system, in accordance with a preferred embodiment of the present invention.

FIG. 3B illustrates a simplified block and flow diagram of the derivation and application of temperature control settings for a semiconductor processing of wafers in a multi-zone furnace, in accordance with an embodiment of the present invention. Multi-zone thermal processing system 40 is comprised of a multi-zone semiconductor furnace 10 which receives temperature commands 42 and provides temperature measurements in the form of feedback illustrated as temperature measurements 44. Temperature commands 42 and temperature measurements 44 are exchanged with a furnace power controller 46 which may be further physically integrated with multi-zone semiconductor furnace 10 or may be separately attached. Furnace power controller 46 receives discrete temperature commands 42 for each specific zone and configures multi-zone semiconductor furnace 10 accordingly.

Multi-zone thermal processing system 40 is further comprised of a furnace multi-zone temperature control system 48 which utilizes the modeling described herein for the derivation of the specific zone temperature 42 illustrated generally as temperature control settings 50. The calculation of temperature control settings 50 is further performed within multi-zone temperature control system 48 and is calculated from inputs illustrated as desired film thickness 52 and from post-run measured film thicknesses for each zone, generally depicted as measured film thickness 54. Measured film thicknesses 54, derived from an evaluation tool such as film thickness measurement device 56, provides feedback to multi-zone temperature control system 48 upon the evaluation of the deposited films post-run on specific wafers, such as test wafers 58. As illustrated, once test wafers 58 undergo an evaluation at film thickness measurement device 56, they may be returned to multi-zone semiconductor furnace 10 for subsequent run processing. While the present illustration depicts test wafers 58 being removed from multi-zone semiconductor furnace 10 for an ex situ measurement, the present invention further contemplates film thickness measurement capability being present within semiconductor furnace 10 for an in situ measurement of a film thickness.

While FIG. 3B has illustrated the general functional components of an embodiment of the present invention, a specific implementation and the mathematical flow of the calculations will be described by way of example. The specific implementation of the modeling of the present invention contemplates the simplification of the mathematical computations by retaining temperature as a sole independent variable that drives the dependent variable of film thickness. In order to illustrate a specific example, the five-zone illustrative depiction will be maintained for a specific exemplary calculation. In such an example, the independent variable, temperature, has five zones that are given separate temperature set-points. Due to the proximity of the heating elements, a calculation of the interaction of nitride film growth is illustrated, for example, between elemental zones when an adjustment to one zone has been made. In one specific implementation, a configuration was set up using the following equipments: (1) an ASM-A400 LPCVD VF multi-zone diffusion furnace manufactured by AM International N.V. of The Netherlands; (2) a film thickness measurement device, such as a UV1250 from KLA-Tencor of San Jose, Calif.; and (3) bare silicon test wafers. The example was performed as a full factorial example where both positive and negative changes in each region were used. The arrangement further utilized a plurality, such as three test wafers per region to not only increase the sample size but also to mitigate the effects of any extreme range samples.

Table 1 below summarizes measured data obtained during an arrangement of the example described above with all data being shown as a reflection of the baseline data which depicts changes in film thickness as measured in angstroms in all zones with the corresponding temperature change in each specific zone. Additionally, the test results were rounded to zero if the absolute data value was below 3 angstroms in order to mitigate the effects of any measurement noise.

| Nitride Process Example of Film Thickness Changes Resulting from Temperature Changes in Corresponding Zones. | | | | | |
|---|---|---|---|---|---|
| | Zone 1 | Zone 2 | Zone 3 | Zone 4 | Zone 5 |
| Zone 1 PLUS | 33.19967 | 0 | 0 | 0 | 0 |
| Zone 1 MINUS | −29.353 | 0 | 0 | 0 | 0 |
| Zone 2 PLUS | −8.45833 | 21.02367 | 0 | 0 | 0 |
| Zone 2 MINUS | 4.705333 | −16.1007 | 0 | 0 | −5 |
| Zone 3 PLUS | −8.01067 | 7.847667 | 32.89033 | 11.32967 | −6.316 |
| Zone 3 MINUS | 0 | −9.317 | −26.8593 | −15.211 | −5.036 |
| Zone 3 PLUS | −10.4863 | −12.548 | −13.9473 | 19.204 | 5.636 |
| Zone 4 MINUS | 0 | 0 | 0 | −28.426 | −14.0953 |
| Zone 5 PLUS | 0 | 0 | 0 | −8.35967 | 17.758 |
| Zone 5 MINUS | 0 | 0 | 0 | 3.408333 | −27.0213 |

In Table 1, the designation, "Zone×PLUS," corresponds to a plus 1.5° C. temperature change in the corresponding zone while a "Zone×MINUS" designator corresponds to a minus 1.5° C. temperature change in the respective zone. In the present test case, three data points (PLUS, baseline, MINUS) for each zone enables the generation of quadratic equations that describe the process in a narrow temperature zone of approximately 3° C. around a specific process temperature. The specific quadratic equation becomes:

$$A_2 \cdot \Delta T^2 + A_1 \cdot \Delta T = \Delta FT \qquad (4)$$

where the matrices are:

$$A_2 = \begin{bmatrix} 0.854815 & -0.834 & -1.78015 & -2.3303 & 0 \\ 0 & 1.094 & -0.32652 & -2.78844 & 0 \\ 0 & 0 & 1.340222 & -3.09941 & 0 \\ 0 & 0 & -0.86252 & -2.04933 & -1.1003 \\ 0 & -1.11111 & -2.52267 & -1.87985 & -2.05852 \end{bmatrix}$$

$$A_1 = \begin{bmatrix} 20.85089 & -4.38789 & -2.67022 & -3.49544 & 0 \\ 0 & 12.37478 & 5.721556 & -4.18267 & 0 \\ 0 & 0 & 19.91656 & -4.64911 & 0 \\ 0 & 0 & 8.846889 & 15.87667 & -3.92267 \\ 0 & 1.666667 & -0.42667 & 6.577111 & 14.92644 \end{bmatrix}$$

Given $A_2$ and $A_1$ matrices and film thickness changes for each zone, the system of quadratic equations (4) may be solved for $\Delta T$ and temperature changes for each zone may be calculated for a specific furnace. It should be noted that the equations (4) hold for temperature changes outside of the experimental temperature range, however, the accuracy can vary.

The mathematical model illustrates a relationship between film thickness changes and zone temperature changes. As such, it is possible to solve the equations to determine a relationship or function in which each zone temperature change can be treated as a function of the film thickness changes for all zones, namely:

$$\Delta T_i = f(\Delta FT_1, \Delta FT_2, \ldots \Delta FT_n) \quad (5)$$

where n is number of zones.

Solving the system of equations (3) for $\Delta T$ arrives at the feedback control mechanism for performing run-to-run control within the multi-zone furnace as calculated from coefficients $a_{ki,j}$ and post-process measured film thickness $FT_i$ at each zone after each run:

$$T_{is} = T_{ip} - \Delta T_i \quad (6)$$

where $i \in 1,2,\ldots,n$—up to the number of process zones, $T_{is}$ are desirable temperature settings for corresponding process zones, and $T_{ip}$ is the previous temperature settings for corresponding process zones.

Although an analytical solution for the system or model of polynomials in equations (3) is not directly derivable, it is possible to solve equations using numerical methods. By deriving iteratively approximating roots of the system through numerical solutions, practical accuracy is attainable for a solution of $\Delta T$. In a practical implementation of the deployment of the modeling of the present invention, it is desirable to minimize process fluctuations from run-to-run by calculating suggested zone temperature settings, $T_{is}$, using all measured film thicknesses and previous temperature settings for each zone as is inherently described in equation (6).

A thorough solution of equation (3) may result in a number of possible real root sets. Therefore, a selection of a preferable or preferred set of temperature adjustments from among the available solutions is desirable. One such selection criteria is to select a solution that results in a minimal amount of adjustments to the system, meaning the minimum overall change of a somewhat characterized process. Therefore, one such selection process for deriving a preferred set of temperature adjustments from a larger set of solutions of temperature adjustments is to select the set of temperature adjustments that results in the smallest overall sum of temperature adjustments. Such a minimization may be arrived at using a distance formula to select the set that results in minimum changes in the furnace control settings.

A form of the Euclidean distance function is an acceptable selection process and is defined as:

$$D = \sqrt{\sum_i \Delta T_i^2} \text{ or } D = \sqrt{\sum_j \Delta y_j^2} \quad (7)$$

where $\Delta T_i$ is a temperature adjustment for zone i, and $\Delta y_j$ is a control parameter adjustment. Some weighting factors may enhance the equation (7) giving priority to certain temperature zones in case of diffusion furnace and/or scaling process parameters that have different units of measure in the case of other semiconductor processes:

$$D = \sqrt{\sum_i w_i \cdot \Delta T_i^2} \text{ or } D = \sqrt{\sum_j w_j \cdot \Delta y_j^2} \quad (8)$$

Calculating weighted Euclidean distances for all root sets and selecting the minimum distance or sum set results in a least-changes solution for application to the multi-zone furnace.

Figure 4A:
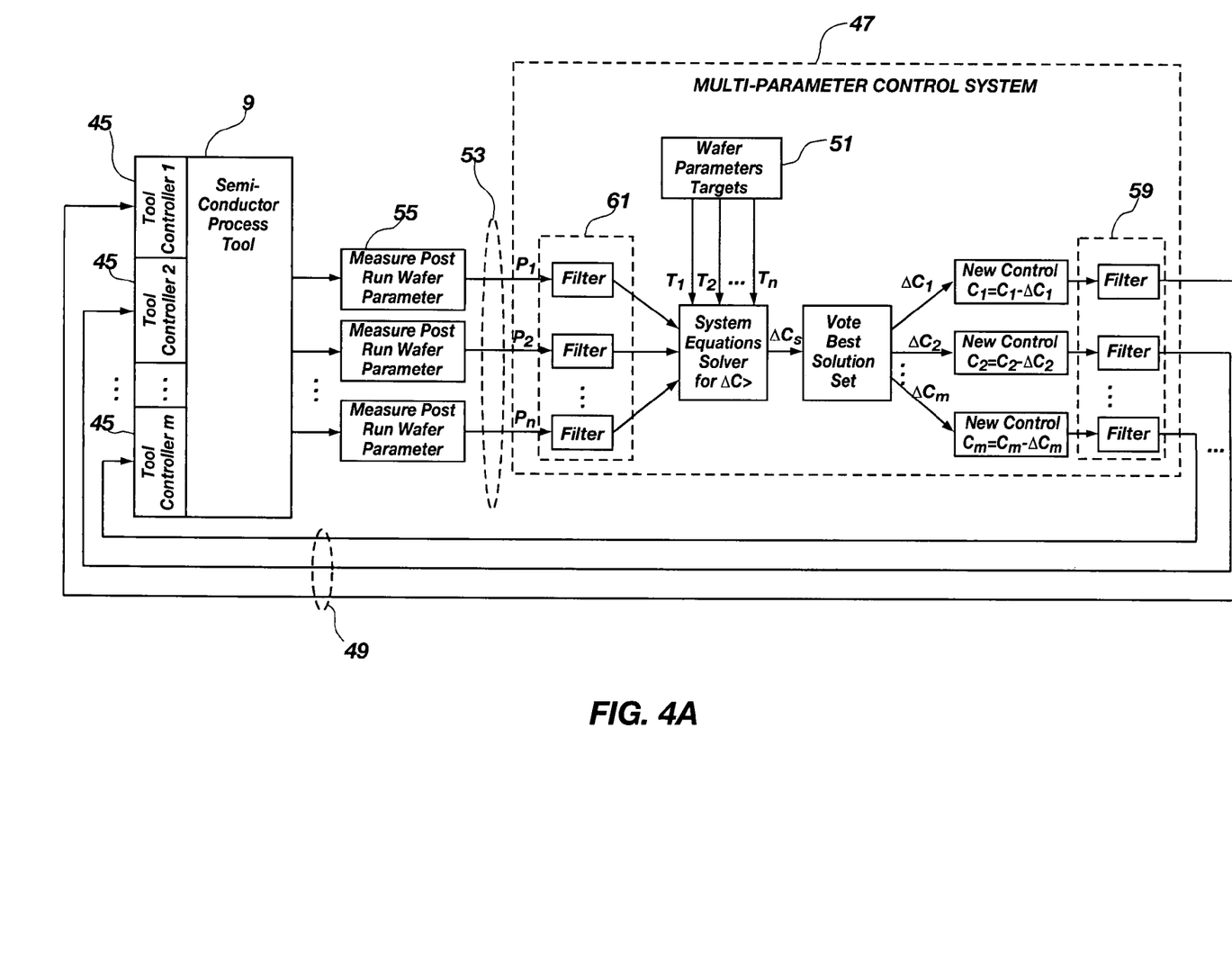
FIG. 4A is a block diagram of a multi-parameter control system, in accordance with an embodiment of the present invention.

FIG. 4A is a block diagram of a multi-parameter control system 47, in accordance with an embodiment of the present invention. FIG. 4A illustrates a computational modeling diagram of the wafer processing and modeling as described herein, and more specifically with regard to the multi-parameter control system embodiment of FIG. 3A. FIG. 4A further illustrates optional filtering 59 which provides a further enhancement to the present invention by applying data filtering before applying control signals to the process tool controllers 45 of the semiconductor process tool 9. Such a filtering process provides filtering to remove noise which may be attributed to the process or control.

Additionally, noise associated with wafer quality parameters measurement device 55 (FIG. 3A) may be removed through the location of a filter, illustrated as filter 61 which removes noise attributed to the quality measurement process. Suitable filtering techniques include exponentially weighted moving average (EWMA) techniques as well as other acceptable approaches known by those of ordinary skill in the art. The modeling technique of an embodiment of the present invention utilizes measured wafer quality parameters 53 to calculate parameter modifications. Furthermore, selecting or voting the best solution from among the pool of possible solutions makes the process more stable as well as providing for a more uniform process.

Figure 4B:
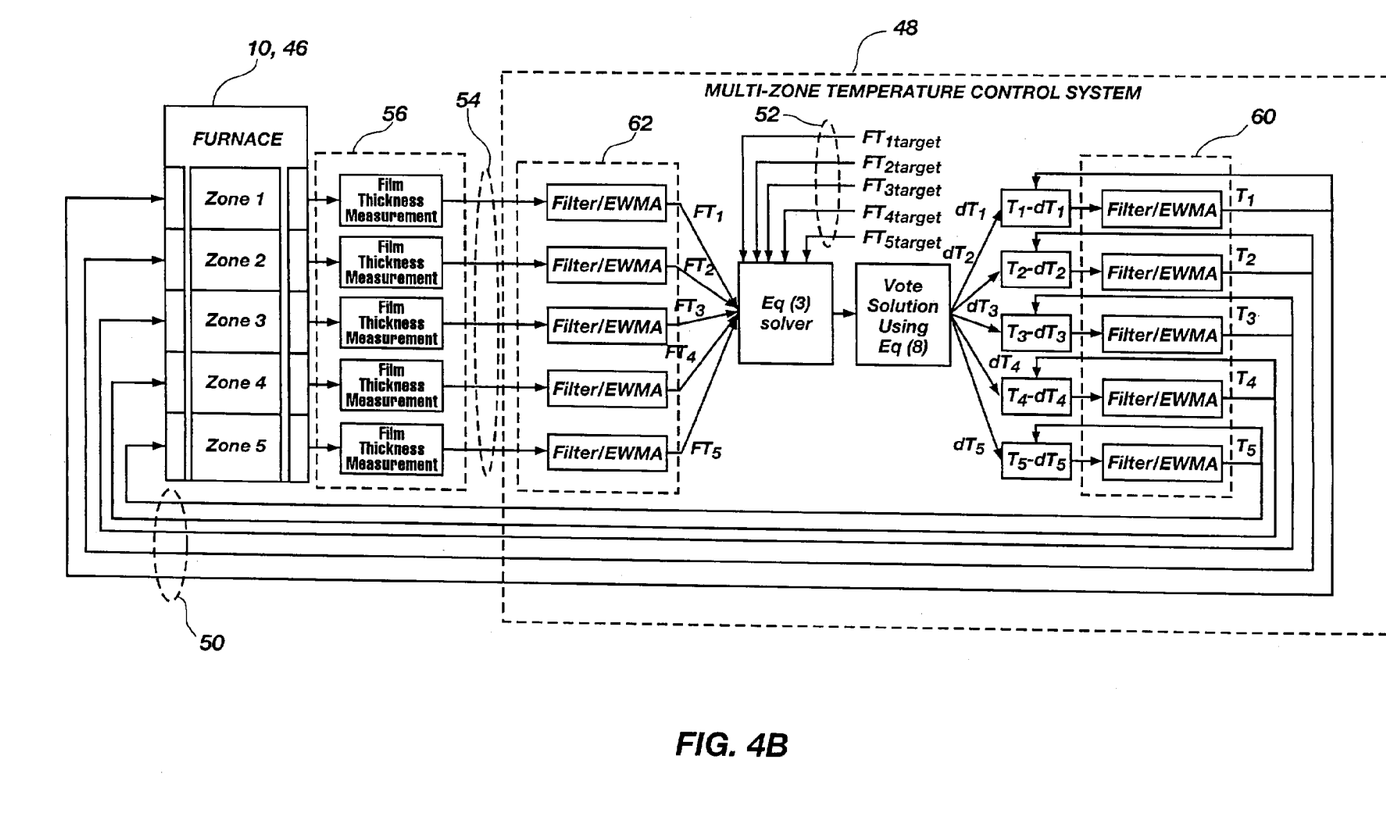
FIG. 4B is a block diagram illustrating the computational components utilized within a multi-zone temperature control system, in accordance with an embodiment of the present invention.

FIG. 4B illustrates a computational modeling diagram of the wafer processing and modeling as described herein, and more specifically with regard to the thermal processing embodiment of FIG. 3B. FIG. 4B further illustrates optional filtering 60 which provides a further enhancement to the present invention by applying data filtering before applying control signals to the multi-zone furnace. Such a filtering process provides filtering to remove noise which may be attributed to the process or control.

Additionally, noise associated with film thickness measurements from the film thickness measurement device 56 may be removed through the location of a filter, illustrated as filter 62 which removes noise attributed to the film thickness measurement process. One such filtering scheme is illustrated as an exponentially weighted moving average (EWMA)

which is utilized for estimating process deviations. Other techniques are also contemplated within the scope of the present invention including the utilization of a proportional integral derivative (PID) control to perform filtering.

The modeling technique of an embodiment of the present invention utilizes measured film thicknesses from all zones to simultaneously calculate the temperature change for each specific zone which applies the temperature control strategy more effectively than by treating each zone separately. Furthermore, selecting or voting the best solution from among the pool of possible solutions makes the process more stable as well as providing for a more uniform process.

Figure 5:
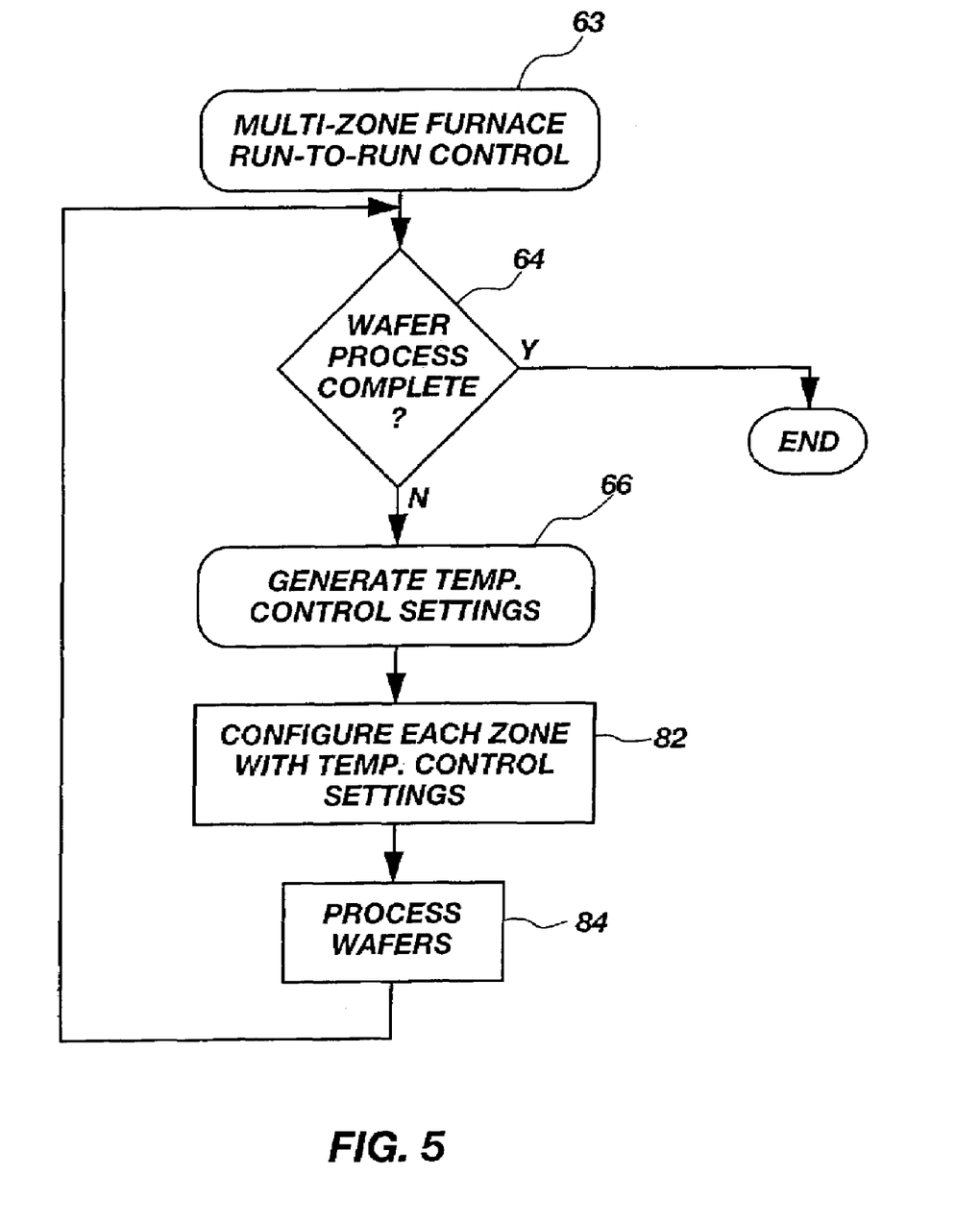
FIG. 5 is a flow chart illustrating a semiconductor process utilizing a multi-zone control system, in accordance with an embodiment of the present invention.
Figure 6:
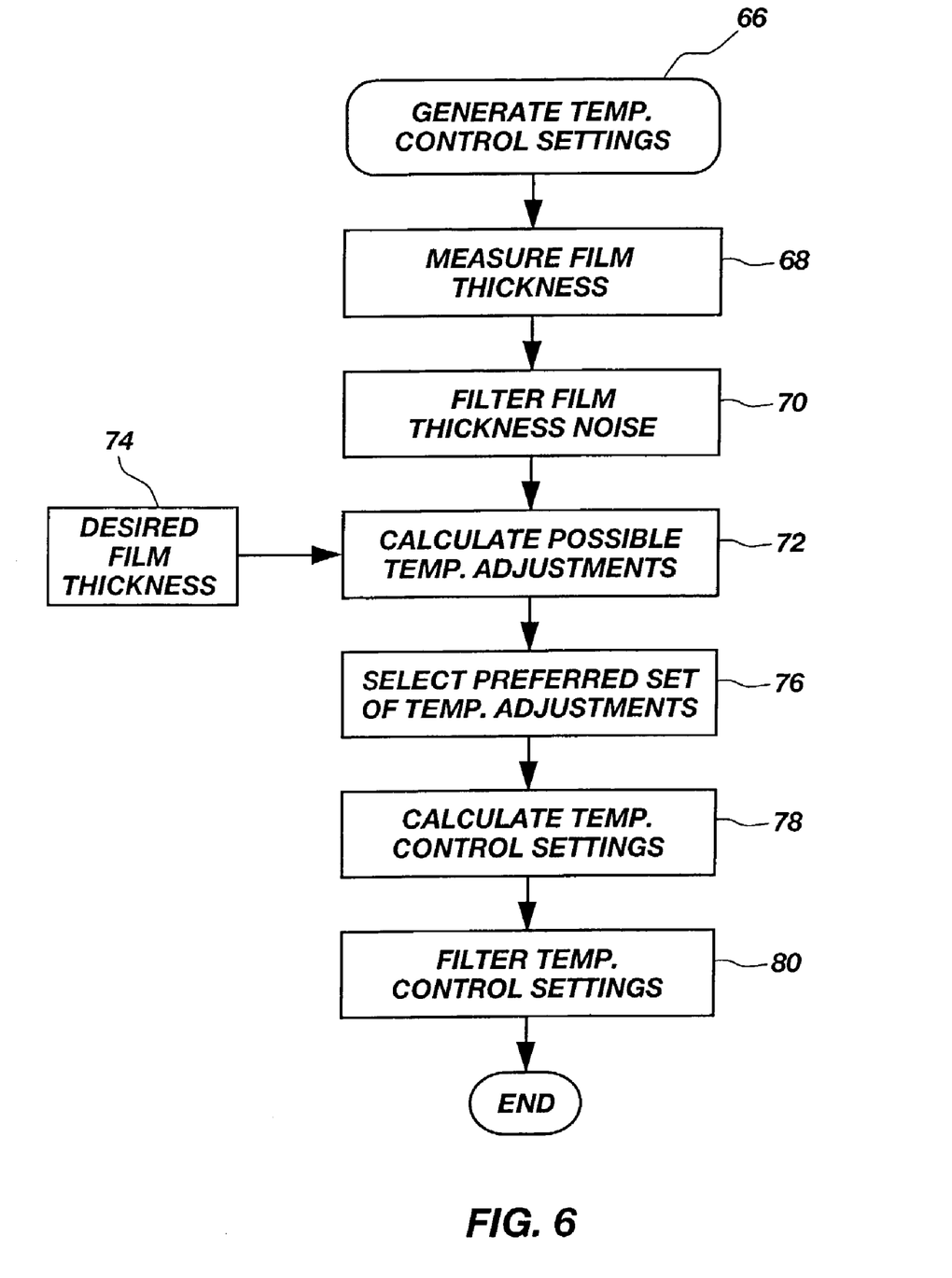
FIG. 6 is a flow chart of the steps involved for calculating the control settings for each zone of a multi-zone semiconductor furnace.

FIGS. 5 and 6 illustrate a method for applying a film to a semiconductor wafer in a multi-zone furnace having thermal interdependencies by calculating temperature control settings that account for such thermal interdependencies. The methods of FIGS. 5 and 6, either individually or in combination and in whole or in part, may be implemented in computer instructions for execution by a processor. Such computer instructions may take the form of a computer program having one or more subroutines, modules or objects as known to one of ordinary skill in the art. Such a computer program may be stored on a data storage medium or device, for example and not by way of limitation, a floppy disk, compact disc—read only memory (CD-ROM), digital versatile disc (DVD), hard disk, read only memory (ROM), dynamic random access memory (DRAM), or any other suitable data storage medium or device. The processor may be a general purpose microprocessor, a special purpose processor, an application specific integrated circuit (ASIC) or any other processor configured to execute instructions either, in software or hardware-based logic such as a state machine. In the case where the processor is an ASIC, the term "computer instructions," as referred to above, may imply permanently implemented and specific state machine operations. The selection and implementation of a processor for use in accordance with the present invention is within the knowledge of a person of ordinary skill in the art and, thus, will not be further elaborated herein.

In FIG. 5, a method 63 processes a plurality of wafers through run-to-run control of the temperature control settings by way of the calculation of temperature adjustments based upon the characterization of the thermal interdependencies of the zones of a multi-zone semiconductor processing furnace. In FIG. 5, a query act 64 determines if the process is complete, meaning the quantity of runs has been completed to obtain the desired film thickness. If the desired thickness has been achieved, then processing is completed. However, if the desired film thickness has not been achieved, then processing passes to a generate temperature control settings process 66 for the calculation of temperature control settings according to the interdependencies of the multiple zones, as illustrated in FIG. 6.

Referring to FIG. 6, temperature control settings for a multi-zone semiconductor furnace are generated by measuring, in an act 68, a film thickness of a semiconductor wafer from each zone of the multiple zones as deposited in the previous process run of the wafer. Measurements may be performed by a film thickness measurement device that operates on the wafers ex situ (i.e., outside of the multi-zone furnace). Alternatively, the measurement of the film thickness may be performed in situ (i.e., with the wafers remaining resident in the multi-zone furnace).

Once the measured film thickness is derived, an optional act 70 filters noise as induced by the measuring process. It is appreciated that measurement tools inject noise into a system because of their quantization properties. Therefore, if the noise is appreciable and can be readily characterized, then filtering of the noise is desirable. Similarly, the process itself may be subject to random fluctuations that are not captured in the model. Therefore, optional act 70 helps to remove combined random noise of the manufacturing process and measuring process.

An act 72 receives both the measure film thickness 68 as well as the desired or target film thickness 74 for performing the calculation of at least one set of temperature adjustments for each of the zones based upon the mathematical modeling previously described. An act 76 selects a preferred set of temperature adjustments from among a plurality of possible sets when the polynomial solution provides for a plurality of possible solutions.

An act 78 calculates temperature control settings for each zone of the multi-zone semiconductor furnace from the selected set of temperature adjustments. As described above, the selection criteria may vary depending upon the process sensitivities. One such criteria includes selecting a set of possible temperature control settings that interjects the minimal adjustments to the system. Such a least-sum solution described above minimizes the adjustments from the norm thereby providing lesser disruptions to a somewhat characterized process.

An act 80 provides an optional filtering process for data filtering to accommodate stability or other process noise attributes derived from heuristic analysis. Exemplary filtering techniques include PID and EWMA control schemas appreciated by those of ordinary skill in the art. Temperature control settings process 66 then returns (FIG. 5) for performing an act 82 where the generated temperature control settings are forwarded to the multi-zone semiconductor furnace for utilization during a subsequent run, as depicted by act 84. Processing then returns following the completion of the subsequent run to query act 64 for determining the state of completion of the entire process.

It is also contemplated that the aforementioned techniques, systems, and methods may be applied to other types of semiconductor processes that have one or more desired wafer quality parameters and one or more process control parameters. By way of example and not limitation, processes such as Chemical Vapor Deposition (CVD), dry etching, wet etching, photo lithography and other semiconductor manufacturing processes are also suitable processes for controlling using the approaches described herein.

Specific embodiments have been shown by way of example in the drawings and have been described in detail herein, however the invention may be susceptible to various modifications and alternative forms. It should be understood that the invention is not intended to be limited to the particular forms disclosed. Rather, the invention includes all modifications, equivalents, and alternatives falling within the spirit and scope of the invention as defined by the following appended claims.

What is claimed is:

1. A method for generating control settings for a multi-parameter semiconductor tool, comprising:

measuring at least one measured parameter from a semiconductor wafer processed in the multi-parameter semiconductor tool;

calculating at least one set of control adjustments including control adjustments for each of the control settings of the multi-parameter semiconductor tool based on the at least one measured parameter and a desired wafer parameter;

selecting a preferred set of control adjustments from the at least one set of control adjustments;

from the preferred set of control adjustments, calculating the control settings for the multi-parameter semiconductor tool; and wherein calculating includes calculating the at least one set of control adjustments from polynomial equations approximating functional relations including a measured film thickness change in each zone in which the wafer parameter changes depend on each of the control setting changes of the multi-parameter semiconductor tool.

2. A method for generating control settings for a multi-parameter semiconductor tool, comprising:

measuring at least one measured parameter from a semiconductor wafer of the multi-parameter semiconductor tool;

calculating at least one set of control adjustments including control adjustments for each control setting of the multi-parameter semiconductor tool based on the at least one measured parameter and a desired wafer parameter;

selecting a preferred set of control adjustments from the at least one set of control adjustments, wherein selecting a preferred set of control adjustments comprises selecting the preferred set of control adjustments as one of the at least one set of control adjustments of a predetermined criterion;

from the preferred set of control adjustments, calculating the control settings for the multi-parameter semiconductor tool and wherein the predetermined criterion is a set of control adjustments having a smallest sum, wherein calculating includes calculating the at least one set of control adjustments from polynomial equations approximating functional relations including a measured film thickness change in each zone in which the wafer parameter changes depend on each of the control setting changes of the multi-parameter semiconductor tool.

3. The method of claim 2, wherein the smallest sum is a weighted smallest sum.

4. A method for generating temperature control settings for a multi-zone semiconductor furnace, comprising:

measuring a measured film thickness change from a semiconductor wafer from each zone of the multi-zone semiconductor furnace;

calculating at least one set of temperature adjustments including a temperature adjustment for each zone of the multi-zone semiconductor furnace from the measured film thickness change and a desired film thickness for each zone;

selecting a preferred set of temperature adjustments from the at least one set of temperature adjustments; and from the preferred set of temperature adjustments, calculating the temperature control settings for each zone of the multi-zone semiconductor furnace, wherein calculating includes calculating the temperature control settings from polynomial equations approximating functional relations including a measured film thickness change in each zone in which the wafer parameter changes depend on each of the control setting changes of the multi-parameter semiconductor tool.

5. The method of claim 4, wherein measuring a measured film thickness change is performed in situ.

6. The method of claim 4, wherein measuring a measured film thickness change is performed ex situ.

7. The method of claim 4, wherein calculating at least one set of temperature adjustments further includes modeling the measured film thickness change for each of the zones as a function of a temperature change from all of the zones of the multi-zone semiconductor furnace.

8. The method of claim 4, wherein calculating at least one set of temperature adjustments includes calculating the at least one set of temperature adjustments from the polynomial equations approximating transfer functions in which the measured film thickness change in each zone depends on each temperature change from all zones of the multi-zone semiconductor furnace.

9. The method of claim 4, wherein selecting a preferred set of temperature adjustments comprise selecting the preferred set of temperature adjustments as one of the at least one set of temperature adjustments conforming to a predetermined criterion.

10. The method of claim 9, wherein the predetermined criterion is a set of temperature adjustments having a smallest sum.

11. The method of claim 10, wherein the smallest sum is a weighted smallest sum.

12. The method of claim 4, further comprising applying a filter to the measured film thickness change to mitigate derived process and measurement noise.

13. The method of claim 4, further comprising applying a filter to the temperature control settings to mitigate derived process and control noise.

14. A method for controlling a multi-zone semiconductor processing furnace, comprising:

generating temperature control settings for the multi-zone semiconductor furnace, including:

calculating at least one set of temperature adjustments including a temperature adjustment for each zone of the multi-zone semiconductor furnace from a mathematical model wherein a measured film thickness change from a semiconductor wafer from each zone is defined as a function of a temperature change from all of the zones of the multi-zone semiconductor furnace;

selecting a preferred set of temperature adjustments from the at least one set of temperature adjustments; and from the preferred set of temperature adjustments, calculating the temperature control settings for each zone of the multi-zone semiconductor furnace, wherein calculating includes calculating the temperature control settings from polynomial equations approximating functional relations including a measured film thickness change in each zone in which the wafer parameter changes depend on each of the control setting changes of the multi-parameter semiconductor tool; and applying the temperature control settings respectively to each of the zones of the multi-zone semiconductor furnace.

15. The method of claim 14, wherein measuring a measured film thickness change is performed in-line without removing the wafers from the multi-zone semiconductor furnace.

16. The method of claim 14, wherein measuring a measured film thickness change is performed off-line by removing the wafers from the multi-zone semiconductor furnace.

17. The method of claim 14, wherein calculating at least one set of temperature adjustments includes calculating the at least one set of temperature adjustments from polynomial equations approximating transfer functions in which the measured film thickness change in each zone depends on each temperature change from all zones of the multi-zone semiconductor furnace.

18. The method of claim 14, wherein selecting a preferred set of temperature adjustments further comprises selecting the preferred set of temperature adjustments as a one of the at least one set of temperature adjustments having a smallest sum.

19. The method of claim 14, further comprising applying a filter to the temperature control settings to mitigate derived process and control noise.

20. A method for run-to-run control of a multi-zone semiconductor furnace, comprising for each run of at least one wafer in each of a plurality of zones within the multi-zone semiconductor furnace:
 calculating at least one set of temperature adjustments including a temperature adjustment for each zone of the multi-zone semiconductor furnace from a mathematical model wherein a measured film thickness change from a semiconductor wafer from each zone is defined as a function of a temperature change from all of the zones of the multi-zone semiconductor furnace;
 selecting a preferred set of temperature adjustments from the at least one set of temperature adjustments; and
 from the preferred set of temperature adjustments, calculating the temperature control settings for each zone of the multi-zone semiconductor furnace, wherein calculating includes calculating the temperature control settings from polynomial equations approximating functional relations including a measured film thickness change in each zone in which the wafer parameter changes depend on each of the control setting changes of the multi-parameter semiconductor tool.

21. The method of claim 20, wherein the mathematical model is a transfer function wherein each temperature adjustment of the at least one set of temperature adjustments is a function of all of the measured film thickness change for the semiconductor wafer from each zone and previous temperature control settings from a previous run of the semiconductor wafers.

22. The method of claim 21, wherein the transfer function is comprised of thermal transfer process coefficients derived experimentally as a function of a specific type of the multi-zone semiconductor furnace.

23. The method of claim 20, wherein selecting a preferred set of temperature adjustments comprise selecting the preferred set of temperature adjustments as one of the at least one set of temperature adjustments conforming to a predetermined criterion.

24. The method of claim 20, wherein the predetermined criterion is a set of temperature adjustments having a smallest sum.

25. The method of claim 24, wherein the smallest sum is a weighted smallest sum.

26. The method of claim 20, further comprising applying a filter to the measured film thickness change to mitigate derived process and measurement noise.

27. The method of claim 20, further comprising applying a filter to the temperature control settings to mitigate derived process and control noise.

28. In a semiconductor process, a method of calculating run-to-run processing control settings, comprising:
 measuring a measured film thickness change from a semiconductor wafer from each zone of a multi-zone semiconductor process device;
 calculating at least one set of control adjustments including a control adjustment for each zone of the multi-zone semiconductor process device from the measured film thickness change and a desired film thickness for each zone;
 selecting a preferred set of control adjustments from the at least one set of control adjustments; and
 from the preferred set of control adjustments, calculating the processing control settings for each zone of the multi-zone semiconductor processing device, wherein calculating includes calculating the control adjustments from polynomial equations approximating functional relations including a measured film thickness change in each zone in which the wafer parameter changes depend on each of the control setting changes of the multi-parameter semiconductor tool.

29. The method of claim 28, wherein calculating at least one set of control adjustments includes calculating the at least one set of control adjustments from polynomial equations approximating transfer functions in which the measured film thickness change in each zone depends on each previous control settings for each zone of a previous run.

30. The method of claim 28, wherein selecting a preferred set of control adjustments further comprises selecting the preferred set of control adjustments as a one of the at least one set of control adjustments having a smallest sum.

31. The method of claim 28, further comprising applying a filter to the processing control settings to mitigate derived process and control noise.

32. A multi-zone thermal processing system, comprising:
 a multi-zone temperature control system for generating temperature control settings including executable instructions for:
  calculating at least one set of temperature adjustments including a temperature adjustment for each zone of the multi-zone semiconductor furnace from a mathematical model wherein a measured film thickness change from a semiconductor wafer from each zone is defined as a function of a temperature change from all of the zones of the multi-zone semiconductor furnace;
  selecting a preferred set of temperature adjustments from the at least one set of temperature adjustments; and
  from the preferred set of temperature adjustments, calculating the temperature control settings for each zone of the multi-zone semiconductor furnace, wherein calculating includes calculating the temperature control settings from polynomial equations approximating functional relations including a measured film thickness change in each zone in which the wafer parameter changes depend on each of the control setting changes of the multi-parameter semiconductor tool; and
 a multi-zone semiconductor furnace for operating in accordance with the temperature control settings for each of the zones.

33. The system of claim 32, wherein the executable instructions for calculating include executable instructions for calculating the at least one set of temperature adjustments from polynomial equations approximating transfer functions in which the measured film thickness change in each zone depends on each temperature change from all zones of the multi-zone semiconductor furnace.

34. The system of claim 32, wherein the executable instructions for selecting a preferred set of temperature adjustments further comprises executable instructions for selecting the preferred set of temperature adjustments as a one of the at least one set of temperature adjustments having a smallest sum.

35. The system of claim 32, wherein the multi-zone temperature control system further comprises executable instructions for applying a filter to the temperature control settings to mitigate derived process and control noise.

36. A computer-readable media having computer-executable instructions for:
    calculating at least one set of temperature adjustments including a temperature adjustment for each zone of a multi-zone semiconductor furnace from a mathematical model wherein a measured film thickness change from a semiconductor wafer from each zone is defined as a function of a temperature change from all of the zones of the multi-zone semiconductor furnace;
    selecting a preferred set of temperature adjustments from the at least one set of temperature adjustments; and
    from the preferred set of temperature adjustments, calculating the temperature control settings for each zone of the multi-zone semiconductor furnace, wherein calculating includes calculating the temperature control settings from polynomial equations approximating functional relations including a measured film thickness change in each zone in which the wafer parameter changes depend on each of the control setting changes of the multi-parameter semiconductor tool.

37. The computer-readable media of claim 36, wherein the computer-executable instructions for measuring a measured film thickness change is performed in-line without removing the wafers from the multi-zone semiconductor furnace.

38. The computer-readable media of claim 36, wherein the computer-executable instructions for measuring a measured film thickness change is performed off-line by removing the wafers from the multi-zone semiconductor furnace.

39. The computer-readable media of claim 36, wherein the computer-executable instructions includes computer-executable instructions for calculating the at least one set of temperature adjustments from polynomial equations approximating transfer functions in which the measured film thickness change in each zone depends on each temperature change from all zones of the multi-zone semiconductor furnace.

40. The computer-readable media of claim 36, wherein the computer-executable instructions for selecting a preferred set of temperature adjustments further comprises computer-executable instructions for selecting the preferred set of temperature adjustments as a one of the at least one set of temperature adjustments having a smallest sum.

41. The computer-readable media of claim 36, further comprising computer-executable instructions for applying a filter to the temperature control settings to mitigate derived process and control noise.

* * * * *

UNITED STATES PATENT AND TRADEMARK OFFICE
CERTIFICATE OF CORRECTION

| | |
|---|---|
| PATENT NO. | : 7,619,184 B2 |
| APPLICATION NO. | : 10/378757 |
| DATED | : November 17, 2009 |
| INVENTOR(S) | : Velichko et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 267 days.

Signed and Sealed this

Fourteenth Day of December, 2010

David J. Kappos
*Director of the United States Patent and Trademark Office*